(12) United States Patent
Krauss et al.

(10) Patent No.: US 6,733,640 B2
(45) Date of Patent: May 11, 2004

(54) SHUTTER ASSEMBLY HAVING OPTIMIZED SHUTTER OPENING SHAPE FOR THIN FILM UNIFORMITY

(75) Inventors: Peter R. Krauss, Bloomington, MN (US); Shaun E. McKinlay, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/131,627

(22) Filed: Apr. 24, 2002

(65) Prior Publication Data

US 2003/0132107 A1 Jul. 17, 2003

Related U.S. Application Data

(60) Provisional application No. 60/348,780, filed on Jan. 14, 2002.

(51) Int. Cl.$^7$ .................... C23C 14/34; B05C 11/11; H01L 21/306
(52) U.S. Cl. .................. 204/298.11; 204/298.28; 118/504; 156/345.3
(58) Field of Search ................. 204/298.11, 298.04, 204/298.28; 118/715, 504; 156/345.3

(56) References Cited

U.S. PATENT DOCUMENTS

| | | | |
|---|---|---|---|
| 4,756,815 A | | 7/1988 | Turner et al. ............. 204/298 |
| 5,223,112 A | | 6/1993 | Tepman ................ 204/298.11 |
| 5,393,398 A | * | 2/1995 | Sugano ................ 204/298.11 |
| 5,415,753 A | | 5/1995 | Hurwitt et al. ......... 204/192.12 |
| 5,505,833 A | | 4/1996 | Werner et al. ......... 204/192.12 |
| 5,538,603 A | | 7/1996 | Guo .................. 204/192.12 |
| 5,741,404 A | | 4/1998 | Cathey ................ 204/192.11 |
| 6,030,513 A | * | 2/2000 | Ghantiwala et al. ... 204/298.11 |
| 6,051,113 A | | 4/2000 | Moslehi ............... 204/192.12 |
| 6,132,805 A | | 10/2000 | Moslehi ................. 427/248.1 |
| 6,290,821 B1 | | 9/2001 | McLeod .............. 204/192.12 |

* cited by examiner

*Primary Examiner*—Steven VerSteeg
(74) *Attorney, Agent, or Firm*—Westman, Champlin & Kelly

(57) ABSTRACT

A shutter assembly for use in a thin-film processing system to control exposure of a substrate to a process energy source includes a shield member having a shutter opening. The shutter opening is defined by sides which are oriented along radial lines of a central axis to promote uniform exposure of the substrate to the process energy source.

18 Claims, 3 Drawing Sheets

FIG. 2
(Prior Art)
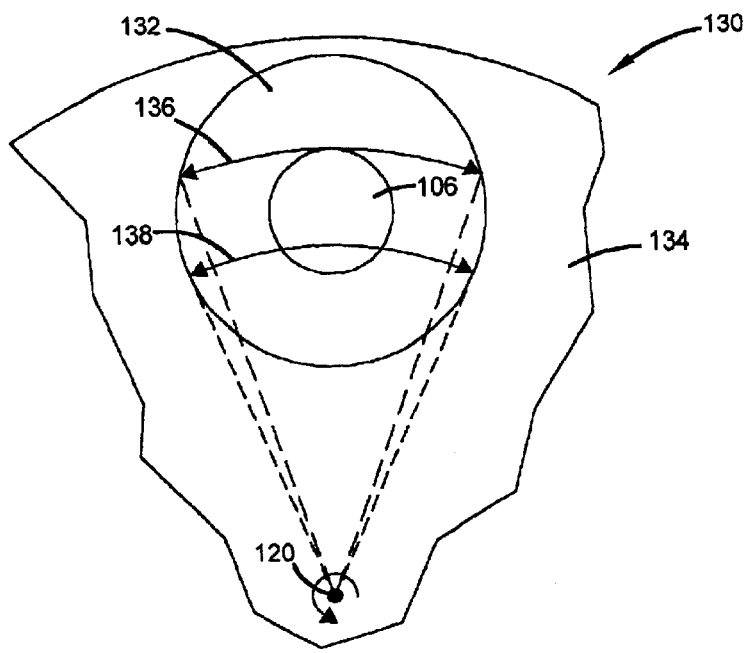
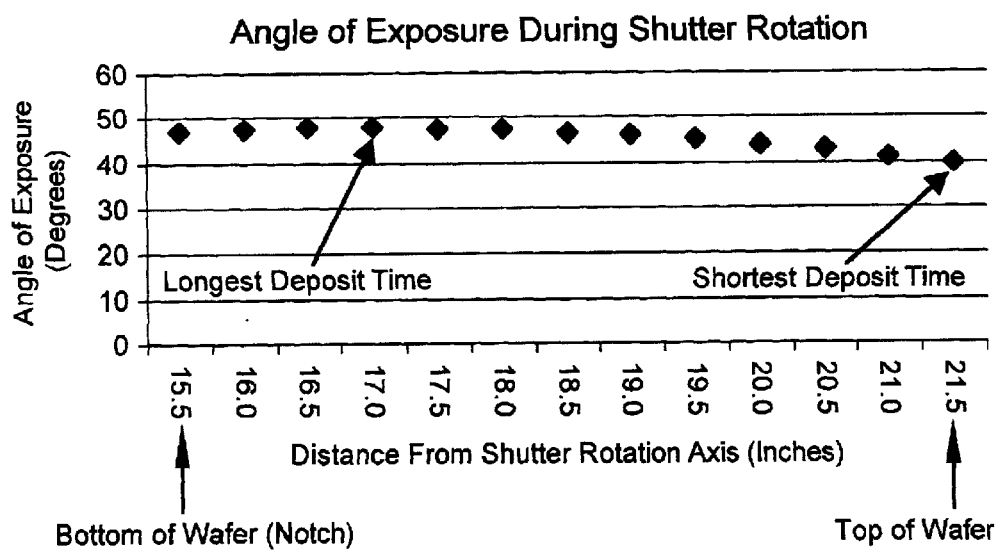
FIG. 3

SHUTTER ASSEMBLY HAVING OPTIMIZED SHUTTER OPENING SHAPE FOR THIN FILM UNIFORMITY

CROSS-REFERENCE TO RELATED APPLICATION

This application claims priority from U.S. Provisional Application No. 60/348,780 filed on Jan. 14, 2002 for inventors Peter R. Krauss and Shaun E. McKinlay and entitled "OPTIMIZED SHUTTER SHAPE FOR THIN FILM UNIFORMITY."

FIELD OF THE INVENTION

The present invention relates to thin-film processing systems for processing semiconductor wafers and other substrates by exposure to the effects of a process energy sources. More particularly, the present invention relates to a shutter assembly for use in a thin-film processing system that is shaped to provide improved material deposition uniformity.

BACKGROUND OF THE INVENTION

Thin-film processing systems are used to form thin multi-layered stacks of material on semiconductor substrates. The multi-layered stacks are generally used to form various electronic signal processing and data storing devices. For instance, semiconductor integrated circuit (IC) applications often include multi-layer interconnect structures comprised of multiple layers of glue/diffusion barrier, interconnect metal, and anti-reflection coating film. Another application that uses multi-layer material structures is magnetic data storage thin-film head devices, such as giant magnetoresistive (GMR) thin-film heads and magnetic random access memory (MRAM) spin-valve tunnel junction devices.

Thin-film processing systems generally include a processing chamber that encloses a substrate support, on which a semiconductor substrate is placed, and a process energy source. Exposure of the substrate to the process energy source results in the formation of a layer of material on the substrate.

In order to meet the never-ending demands for higher disc drive storage capacities, thin-film processing systems must be capable of depositing extremely thin layers of material to form the components of, for example, GMR heads. Additionally, the uniformity of each layer becomes a critical factor in multi-layered structures where the thickness errors are compounded. Therefore, it is desirable that the entire substrate be exposed to the process energy source for the same processing time to promote a uniform deposition of material on the substrate.

The exposure of the substrate to the process energy source is controlled by a shutter assembly. Typical shutter assemblies include a shield member and a circular shutter opening that is rotated about a central axis between a shielding position, in which the shield member blocks exposure of the substrate to the process energy source, to an exposing position, in which the shutter opening is positioned to expose the substrate to the process energy source. Unfortunately, the shape of the shutter opening of these prior art shutter assemblies prevents uniform exposure of the substrate to the process energy source resulting in non-uniform material depositions.

SUMMARY OF THE INVENTION

The present invention relates to a shutter assembly for use in a thin-film processing system that includes a shutter opening having an optimized shape to promote uniform exposure of the substrate to the process energy source. The shutter assembly includes a shield member in which the shutter opening is formed. The shutter opening is defined by sides which are oriented along radial lines of a central axis. The present invention is further directed to a thin-film processing system that includes the above-described shutter assembly.

Other features and benefits that characterize embodiments of the present invention will be apparent upon reading the following detailed description and review of the associated drawings.

BRIEF DESCRIPTION OF THE DRAWINGS

FIG. 2 is a partial top view of a shutter assembly in accordance with the prior art.

FIG. 3 is a chart illustrating the relationship of angle of exposure of a substrate versus the radial distance from a central axis for the prior art shutter assembly of FIG. 2.

DETAILED DESCRIPTION OF ILLUSTRATIVE EMBODIMENTS

Figure 1:
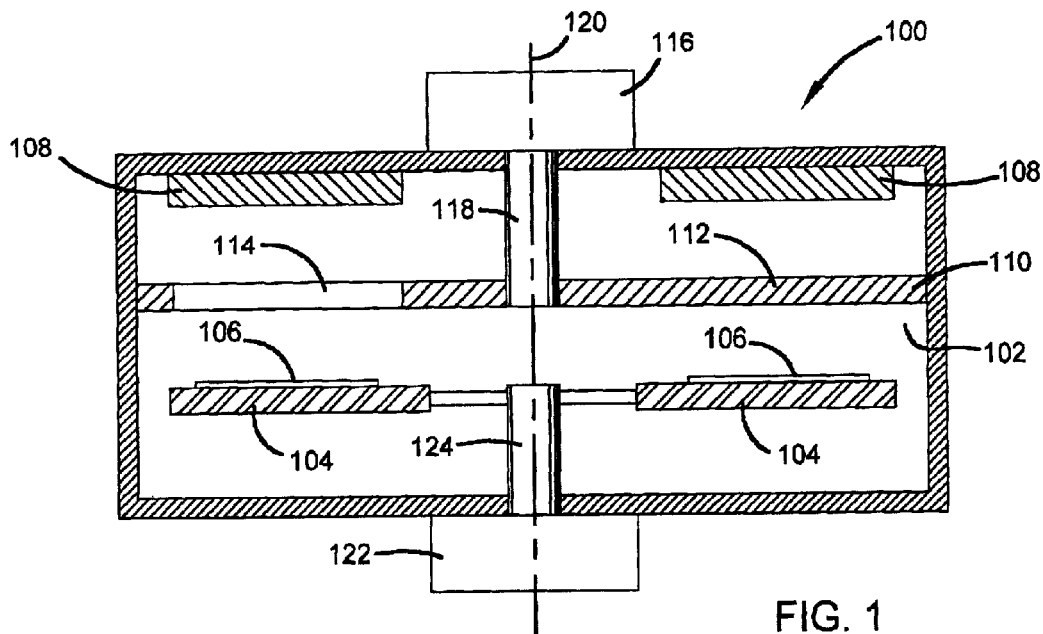
FIG. 1 is a simplified side cross-sectional view of a thin-film processing system in accordance with the present invention.

FIG. 1 is a simplified side cross-sectional view of a thin-film processing system, designated as 100, with which embodiments of the present invention may be used. System 100 includes a vacuum process chamber 102 that encloses at least one substrate support 104, on which a semiconductor substrate 106 is placed, and at least one process energy source or target 108. Exposure of the substrate 106 to the process energy source 108 results in the formation of a layer of target material on the substrate in accordance with known methods. The process energy source 108 can be a physical vapor deposition (PVD) process energy source, a plasma sputtering process energy source, an ion-beam deposition process energy source, a plasma etching process energy source, or other process energy source.

Physical-vapor deposition or PVD is a well-known technique for depositing thin layers of materials onto a substrate for a variety of semiconductor, data storage, optoelectronics, and other applications. Plasma sputtering or plasma PVD is the most widely accepted PVD technique for deposition of various material layers. Typical PVD process energy sources or targets 108 include a cathode and an anode ring that are powered by a DC or RF magnetron or an RF diode power source to create a power differential therebetween. This produces a plasma medium between the target and the substrate 106 within the processing chamber 102 and causes ion bombardment of the target surface. This results in sputtering of the target material which is deposited on the substrate 106 when substrate 106 is exposed by shutter assembly 110.

A shutter assembly 110 separates the substrate 106 from the process energy source 108 and controls a "processing time," during which the substrate is exposed to the process energy source 108. Shutter assembly 110 generally includes a shield member 112 having at least one shutter opening 114. Shutter assembly 110 can also include an indexing mechanism 116 having a rotatable axle 118, to which shield member 112 is attached, as shown in FIG. 1. Indexing mechanism 116 can rotate shutter assembly 110 to control the relative angular positions of shutter opening 114 and substrate 106. During the processing of substrate 106, shutter assembly 110 is rotated about a central axis 120, defined by axle 118, from a shielding position, in which the shield member 112 blocks the deposition of target material on to substrate 106, to an exposing position, in which substrate 106 is exposed to the process energy source 108 through the shutter opening 114 resulting in material deposition on substrate 106. Material deposition on substrate 106 can then be terminated by rotating shutter assembly 110 back to the shielding position. The period that substrate 106 is exposed to the process energy source determines the thickness of the deposited layer of material.

Multiple process energy sources or targets 108 can be used to allow for the formation of different target material layers on substrate 106. Additionally, multiple substrate supports 104 can be provided to allow for the simultaneous processing of multiple substrates 106. The targets 108 and/or the substrate supports 104 can be positioned as desired using an indexing mechanism, such as indexing mechanism 122 that is configured to rotate axle 124 to which supports 104 are connected. In this manner, each substrate 106 can be exposed to a different target 108 to allow for multi-layer depositions of different target materials.

FIG. 2 shows a partial top view of a typical shutter assembly 130, in accordance with the prior art having a circular shutter opening 132. Shutter opening 132 has a diameter of approximately fifteen inches for processing six inch wafers. The shutter opening 132 is radially displaced from the central axis 120 by a distance of approximately eleven inches. During the rotation of shield member 134, the shutter opening 132 rotates between the substrate 106 and the process energy source 108 and exposes substrate 106 to the process energy source 108, as discuss above.

The period of time that substrate 106 is exposed to process energy source 108 varies depending upon the radial distance from central axis 120 due to the shape of shutter opening 132. The reason for this variance in exposure times is due to the differing arc lengths, such as 136 and 138, over which the substrate 106 is exposed as shield member 134 rotates about axis 120. This exposure variance is illustrated in the chart of FIG. 3, which is a plot of the angle of exposure of a substrate 106 versus the radial distance from the central axis 120. This variance in the time that substrate 106 is exposed to the process energy source 108 results in non-uniform deposition of target material over substrate 106. The non-uniformity of the deposition is largest for thin material depositions (short exposure times) where uniformity is critical. This limits the precision at which the thin-film processing system 100 can form a layer of material on the substrate 106 and, thus, the precision at which a multi-layered structure, such as a GMR head, can be formed.

Figure 4:
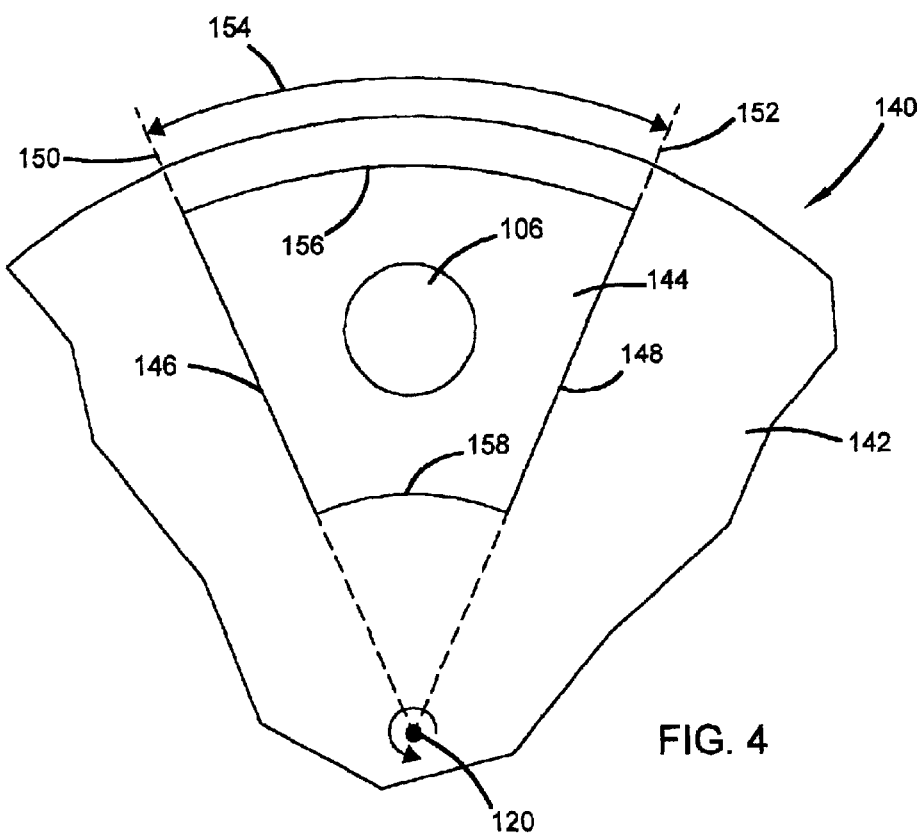
FIGS. 4 and 5 respectively show partial and full top views of a shutter assembly in accordance with embodiments of the present invention.

FIG. 4 is a partial top view of a shutter assembly 140 in accordance with the present invention, which eliminates the exposure time variance problems associated with the above-described prior art shutter assemblies. Shutter assembly 140 includes a shield member 142 having a shutter opening 144. Shutter assembly 140, when used in a thin-film processing system, such as system 100 shown in FIG. 1, can be rotated about central axis 120 to adjust the relative angular positions of shutter opening 144 and substrate 106 and provide the desired shielding and exposing functions.

Shutter opening 144 is defined by sides 146 and 148 of shield member 142. Sides 146 and 148 are respectively aligned with radial lines 150 and 152 of central axis 126.

Due to this configuration, the angle 154 over which substrate 106 is exposed is the same for all radial distances between the outer and inner boundaries 156 and 158 of shutter opening 144. This ensures that the entire substrate 106 is uniformly exposed to the process energy source or target 108 (FIG. 1) as shutter assembly 140 is rotated through the shielding and exposing positions. As a result, the exposure time variance of substrate 106 caused by the shape of prior art shutter openings, such as 132, are eliminated. This results in more uniform depositions of target material on substrate 106, especially thin depositions (short exposure times), and allows for more precise formation of multi-layered structures.

Figure 5:
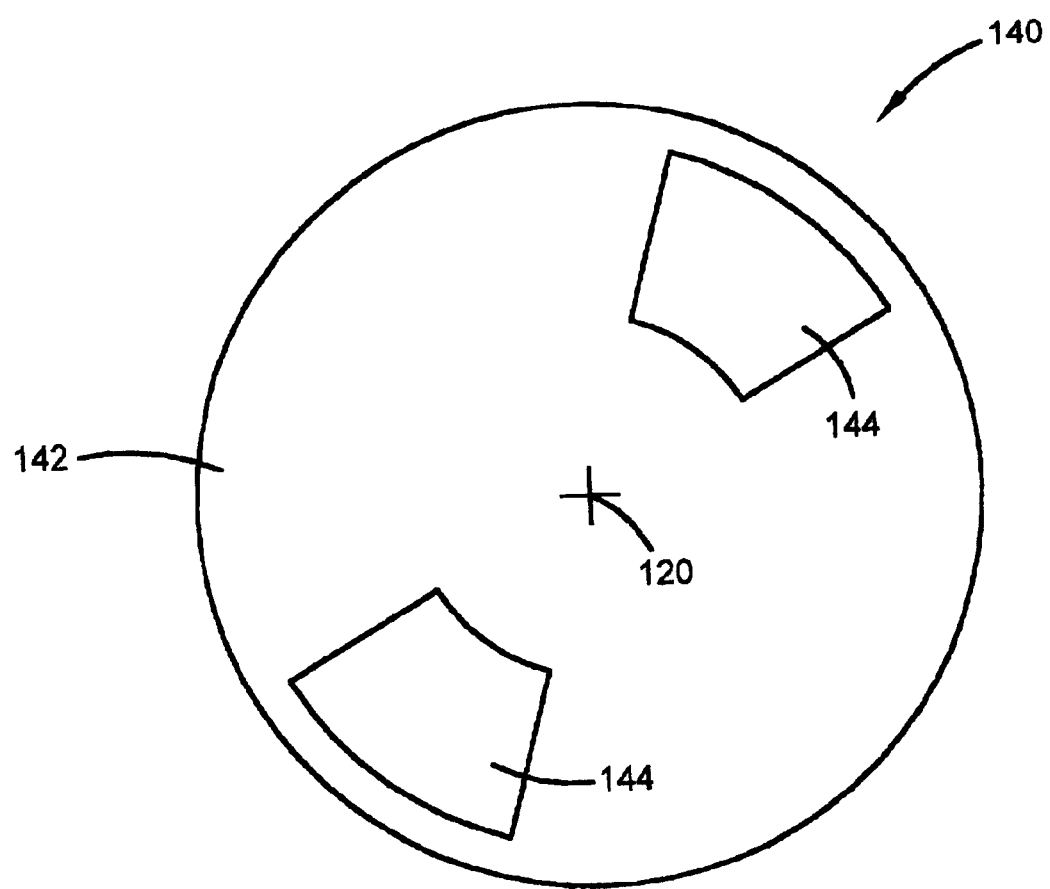

In accordance with one embodiment of the invention, shutter assembly 140 includes at least two shutter openings 144, as shown in FIG. 5. The shutter openings 144 are preferably positioned at the same radial distance from central axis 120 and angularly displaced from each other a predetermined distance.

In summary, one aspect of the present invention is directed to a shutter assembly (such as 140) for use in a thin-processing system (such as 100) to control exposure of a substrate (such as 106) to a process energy source (such as 108). The shutter assembly includes a shield member (such as 142) having a shutter opening (such as 144) that is defined by sides (such as 146 and 148) which are oriented along radial lines (such as 150 and 152) of a central axis (such as 120). In accordance with one embodiment, the shutter assembly includes an indexing mechanism (such as 116) having a rotatable axle (such as 118), that is aligned with the central axis and is attached to the shield member. In accordance with yet another embodiment, the shutter assembly includes at least one additional shutter opening.

Another aspect of the present invention is directed to a thin-film processing system (such as 100) that includes a processing chamber (such as 102), a process energy source (such as 108), a substrate support (such as 104), the above-described shutter assembly (such as 140), and an indexing mechanism (such as 116). The substrate support is adapted to support a substrate (such as 106). The indexing mechanism is adapted to rotate the substrate carrier or the shield member about the central axis (such as 120) to control the relative angular positions, whereby the substrate carrier is exposed to the process energy source from the shutter opening is positioned therebetween. In accordance with various embodiments of the invention, the process energy source can be a physical vapor deposition process energy source, a plasma sputtering process energy source, an ion-beam deposition process energy source, or a plasma etching process energy source.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed.

What is claimed is:

1. A shutter assembly for use in a thin-film processing system to control exposure of a substrate to a process energy source, the shutter assembly comprising a shield member having a shutter opening that is defined by sides which are oriented along radial lines of a central axis, the shield member having a shielding position in which the shield member blocks exposure of the entire substrate to the process energy source, and an exposing position in which the substrate is exposed to the process energy source through the shutter opening.

2. The shutter assembly of claim 1, including an indexing mechanism having a rotatable axle aligned with the central axis and attached to the shield member.

3. The shutter assembly of claim 1, wherein the shield member includes at least one additional shutter opening.

4. A shutter assembly for use in a thin-film processing system to control exposure of a substrate to a process energy source, the shutter assembly comprising a shield member having a plurality of shutter openings positioned at substantially the same radial distance from a central axis and angularly displaced from each other, the shutter openings defined by sides which are oriented along radial lines of the central axis, the shield member having a shielding position in which the shield member blocks exposure of the entire substrate to the process energy source, and an exposing position in which the substrate is exposed to the process energy source through one of the shutter openings.

5. The shutter assembly of claim 4, including an indexing mechanism having a rotatable axle aligned with the central axis and attached to the shield member.

6. A thin film processing system comprising:
   a process chamber;
   a process energy source;
   a substrate support for supporting a substrate;
   the shutter assembly of claim 4; and
   an indexing mechanism for rotating the substrate support or the shield member about the central axis to control their relative angular positions between the shielding and exposing positions.

7. The system of claim 6, wherein the process energy source is selected from the group consisting of a physical-vapor deposition process energy source, a plasma sputtering process energy source, an ion-beam deposition process energy source, and a plasma etching process energy source.

8. A thin-film processing system comprising:
   a process chamber;
   a process energy source;
   a substrate support for supporting a substrate;
   a shutter assembly including a shield member positioned between the process energy source and substrate support, the shield member having a shutter opening that is defined by sides which are oriented along radial lines of a central axis, the shield member having a shielding position in which the shield member blocks exposure of an entire substrate on the substrate support to the process energy source, and an exposing position in which a substrate on the substrate support is exposed to the process energy source through the shutter opening; and
   an indexing mechanism for rotating the substrate support or the shield member about the central axis to control their relative angular positions between the shielding and exposing positions.

9. The system of claim 8, wherein the indexing mechanism includes a rotatable axle aligned with the central axis and attached to the shield member.

10. The system of claim 8, wherein the process energy source is selected from the group consisting of a physical-vapor deposition process energy source, a plasma sputtering process energy source, an ion-beam deposition process energy source, and a plasma etching process energy source.

11. The shutter assembly of claim 8, wherein the shield member includes at least one additional shutter opening.

12. A thin-film processing system comprising:
   a process chamber;
   a process energy source;
   a substrate support for supporting a substrate;
   shield member having a shielding position in which the shield member blocks exposure of an entire substrate on the substrate support to the process energy source; and
   a shutter opening means in the shield member for uniformly exposing the substrate to the process energy source when the shield member is rotated about a central axis through an exposing position in which the shutter opening means is positioned between the process energy source and the substrate.

13. The system of claim 12, wherein the shutter opening means includes a shutter opening that is defined by sides of the shield member that are oriented along radial lines of the central axis.

14. The system of claim 12, wherein the shutter opening means includes a plurality of shutter openings positioned at substantially the same radial distance from the central axis and angularly displaced from each other, the shutter openings are defined by sides of the shield member that are oriented along radial lines of the central axis.

15. The system of claim 12, wherein the process energy source is selected from the group consisting of a physical-vapor deposition process energy source, a plasma sputtering process energy source, an ion-beam deposition process energy source, and a plasma etching process energy source.

16. The system of claim 12, including an indexing mechanism for controlling an angular position about the central axis of the shield member relative to the substrate support.

17. The system of claim 16, wherein the indexing mechanism includes a rotatable axle aligned with the central axis and attached to the shield member.

18. The system of claim 16, wherein the indexing mechanism includes a rotatable axle aligned with the central axis and attached to the substrate support.

* * * * *